(12) United States Patent
Fiorini et al.

(10) Patent No.: US 9,411,054 B2
(45) Date of Patent: Aug. 9, 2016

(54) AMPLIFIER AND RADIATION DETECTOR

(71) Applicants: Carlo Fiorini, Milan (IT); Luca Bombelli, Milan (IT)

(72) Inventors: Carlo Fiorini, Milan (IT); Luca Bombelli, Milan (IT)

(73) Assignees: HORIBA, LTD., Kyoto (JP); POLITECNICO DI MILANO, Milan (IT)

( * ) Notice: Subject to any disclaimer, the term of this patent is extended or adjusted under 35 U.S.C. 154(b) by 391 days.

(21) Appl. No.: 13/956,856

(22) Filed: Aug. 1, 2013

(65) Prior Publication Data

US 2014/0217285 A1   Aug. 7, 2014

(30) Foreign Application Priority Data

Aug. 2, 2012   (JP) .................................. 2012-172332

(51) Int. Cl.
| | |
|---|---|
| G01T 1/00 | (2006.01) |
| G01T 1/17 | (2006.01) |
| H03F 3/08 | (2006.01) |
| H03F 1/02 | (2006.01) |
| G01J 1/46 | (2006.01) |

(52) U.S. Cl.
CPC .. *G01T 1/17* (2013.01); *H03F 1/02* (2013.01); *H03F 3/087* (2013.01); *G01J 1/46* (2013.01); *H03F 2200/261* (2013.01)

(58) Field of Classification Search
CPC ............... G01T 1/17; G01T 7/00; G01T 1/02; G01T 1/161; G01T 1/29
See application file for complete search history.

(56) References Cited

U.S. PATENT DOCUMENTS

| | | | |
|---|---|---|---|
| 3,582,675 A | 6/1971 | Jordan et al. | |
| 5,252,928 A | 10/1993 | Giorgetta | |
| 6,803,555 B1 * | 10/2004 | Parrish et al. | 250/214 C |
| 2012/0132824 A1 * | 5/2012 | Nishino et al. | 250/394 |

FOREIGN PATENT DOCUMENTS

| | | |
|---|---|---|
| JP | H0595237 A | 4/1993 |
| JP | 2000147367 A | 5/2000 |
| JP | 2002221541 A | 8/2002 |
| JP | 2009222480 A | 10/2009 |
| JP | 2011004326 A | 1/2011 |

OTHER PUBLICATIONS

Japanese Office Action corresponding to Patent Application No. 2012-172332; Date of Mailing: Feb. 23, 2016.

* cited by examiner

*Primary Examiner* — David Porta
*Assistant Examiner* — Mamadou Faye
(74) *Attorney, Agent, or Firm* — Cantor Colburn LLP

(57) ABSTRACT

In a preamplifier (amplifier) for detecting radiation, an output of the preamplifier is set as an output of the first amplifying circuit, a capacitor is connected in parallel to the first amplifying circuit, and the second amplifying circuit with a positive gain of less than onefold is connected between the output terminal and the input terminal of the first amplifying circuit through a switch. When the switch is closed, the capacitor is discharged and reset. As the gain of the second amplifying circuit is less than onefold, the gain of the preamplifier is less than the loop gain of the first amplifying circuit alone during the reset operation, making it harder for oscillation to occur. Accordingly, the preamplifier can reduce the compensation capacitance compared to a conventional case and can shorten the reset time, while preventing oscillation.

4 Claims, 2 Drawing Sheets

F I G. 2
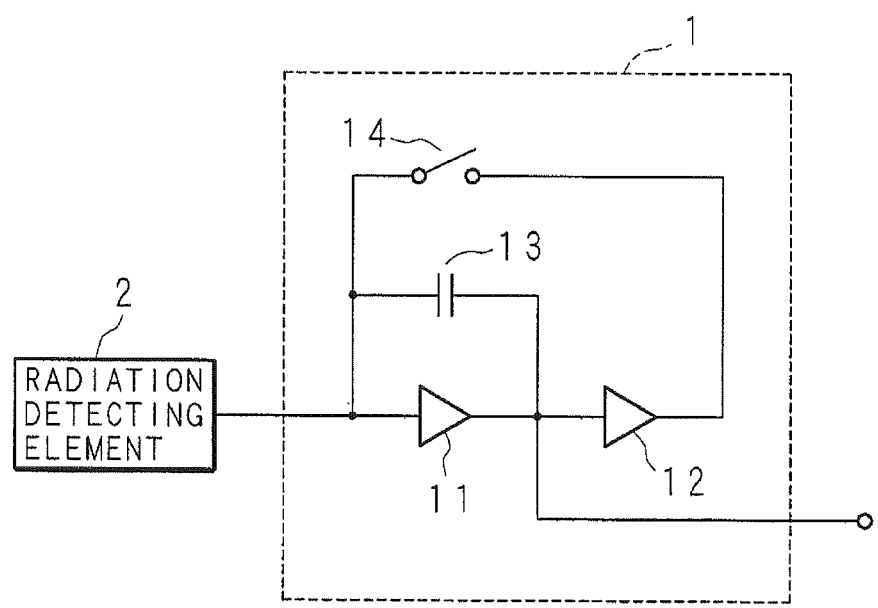

AMPLIFIER AND RADIATION DETECTOR

CROSS-REFERENCE TO RELATED APPLICATIONS

This Nonprovisional application claims priority under 35 U.S.C. §119(a) on Patent Application No. 2012-172332 filed in Japan on Aug. 2, 2012, the entire contents of which are hereby incorporated by reference.

BACKGROUND

1. Technical Field

The present invention relates to a radiation detector and, more particularly, to an amplifier for converting a charge signal output from a radiation detecting element into a voltage signal and to a radiation detector including the amplifier.

2. Description of Related Art

A radiation detector for detecting radiation such as X-rays includes a radiation detecting element such as a SDD (Silicon Drift Detector). The radiation detecting element outputs a charge signal in accordance with energy of the detected radiation. The charge signal is converted into a voltage signal by a preamplifier. The voltage signal is further amplified, and signal processing such as generating a spectrum is performed based on the amplified voltage signal.

FIG. 1 is a circuit diagram of a preamplifier in the conventional radiation detector. Each of a capacitor 33 for feedback (hereinafter also referred to as a feedback capacitor) and a normally-open switch 34 is connected in parallel to an amplifying circuit 31. Each time the charge signal is input from the radiation detecting element to the preamplifier, the charge is stored in a capacitor 33 and thus a value of the voltage signal output from the preamplifier continues to increase. Therefore, the capacitor 33 needs to be reset to discharge the stored charge by closing the switch 34 when the voltage signal reaches a predetermined value. However, resetting causes dead time during which radiation cannot be detected. To shorten dead time, the reset time (the time required to reset) needs to be shortened. Japanese Patent Application Laid-Open No. 2011-4326 discloses a technique for shortening the reset time in the amplifying circuit.

SUMMARY OF THE INVENTION

When a reset operation is performed in a conventional preamplifier, an input terminal and an output terminal of the amplifying circuit 31 are short-circuited. When the input terminal and the output terminal of the amplifying circuit 31 are short-circuited, a loop gain is increased and thus oscillation tends to occur. Conventionally, a compensation capacitance is included in the amplifying circuit 31 for preventing oscillation during the reset operation. The larger the compensation capacitance is, the harder does oscillation occur because a phase margin is increased. However, the larger compensation capacitance slows the processing speed of the amplifying circuit 31. This results in increased reset time and rise time for the voltage signal output from the preamplifier.

The present invention has been made in view of the foregoing circumstances, and an object thereof is to provide an amplifier and a radiation detector that enable to shorten a signal rise time and a reset time while preventing oscillation by improving the arrangement in the circuit.

An amplifier according to the present invention is characterized by comprising: a first amplifying circuit; a capacitor connected between an input terminal and an output terminal of the first amplifying circuit; a switch for discharging the capacitor; and a second amplifying circuit having a positive gain of less than onefold, and including an input terminal connected to the output terminal of the first amplifying circuit and an output terminal connected to the input terminal of the first amplifying circuit through the switch, wherein the first amplifying circuit receives a signal and outputs a signal outside.

A radiation detector according to the present invention is characterized by comprising: an amplifier according to the present invention; and a radiation detecting element generating a charge signal upon detection of radiation, wherein the amplifier receives a charge signal generated from the radiation detecting element and converts the input charge signal into a voltage signal.

In the present invention, the amplifier used for the preamplifier of the radiation detector includes the first amplifying circuit in which a signal is input and output, the capacitor connected in parallel to the first amplifying circuit, and the second amplifying circuit with a positive gain of less than onefold. The second amplifying circuit is connected to the input terminal and the output terminal of the first amplifying circuit through the switch. When the switch closes, the capacitor is reset, and the signal output from the first amplifying circuit is amplified in the second amplifying circuit and input to the first amplifying circuit again. As the gain of the second amplifying circuit is less than onefold, the loop gain during the reset operation is less than the loop gain obtained when using the first amplifying circuit alone, making it harder for oscillation to occur. This may, therefore, reduce the compensation capacitance in the first amplifying circuit compared to the conventional case, and may shorten the signal rise time and the reset time as a result.

In the present invention, the amplifier used for the preamplifier of the radiation detector can prevent oscillation during the reset operation without increasing the compensation capacitance in the amplifying circuit. Therefore, the present invention has such excellent effects that the compensation capacitance may be reduced in the amplifying circuit compared to the conventional case and the signal rise time as well as the reset time for the preamplifier of the radiation detector may be shortened, while preventing oscillation.

The above and further objects and features of the invention will more fully be apparent from the following detailed description with accompanying drawings.

BRIEF DESCRIPTION OF THE DRAWINGS

FIG. 2 is a schematic circuit diagram of a radiation detector according to the present invention.

DETAILED DESCRIPTION

Figure 1:
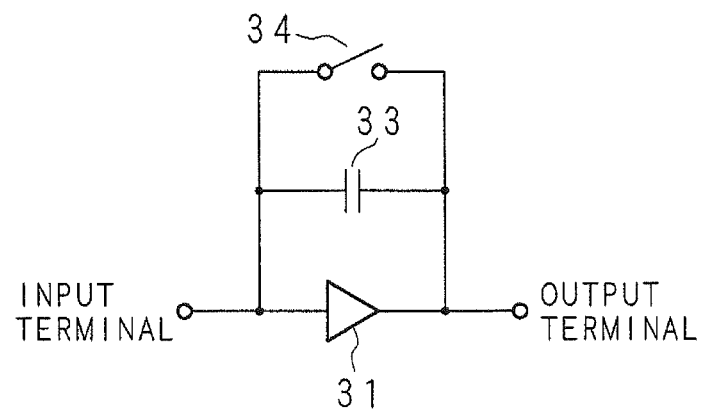
FIG. 1 is a circuit diagram of a preamplifier in a conventional radiation detector.

The present invention is specifically described hereinbelow with reference to the drawings showing embodiments thereof.

FIG. 2 is a schematic circuit diagram of a radiation detector according to the present invention. The radiation detector includes a radiation detecting element 2 for detecting radiation such as X-rays. The radiation detecting element 2 is a semiconductor detecting element such as a SDD. The radiation detecting element 2 generates a charge signal proportional to radiation energy upon entrance of radiation. A preamplifier 1, which is an amplifier of the present invention, is connected to an output terminal of the radiation detecting element 2. The radiation detecting element 2 outputs a charge signal, and the preamplifier 1 converts the charge signal output from the radiation detecting element 2 into a voltage signal proportional to radiation energy. The output terminal of the preamplifier 1 is connected to the output terminal of the radiation detector.

The radiation detector may be included in, for example, an X-ray detection apparatus, in which the output terminal of the radiation detector is connected to a signal processing unit through an amplifier. The voltage signal output from the radiation detector is amplified in the amplifier and processed in the signal processing unit. For example, the signal processing unit counts each value of the voltage signal and obtains the detected X-ray spectra. Also, the radiation detector may be included in, for example, an X-ray fluorescence spectrometer. The X-ray fluorescence spectrometer detects fluorescence X-rays emitted from a sample and performs an X-ray fluorescence analysis of the sample.

The preamplifier 1 includes the first amplifying circuit 11. The charge signal is input from the radiation detecting element 2 to the input terminal of the first amplifying circuit 11, and the voltage signal is output from the output terminal of the first amplifying circuit 11 to the outside of the preamplifier 1. A feedback capacitor 13 is connected in parallel to the first amplifying circuit 11. In other words, the capacitor 13 is connected between the input terminal and the output terminal of the first amplifying circuit 11. The preamplifier 1 further includes a second amplifying circuit 12, which has a positive gain of less than onefold. The input terminal of the second amplifying circuit 12 is connected to the output terminal of the first amplifying circuit 11, and the output terminal of the second amplifying circuit 12 is connected to the input terminal of the first amplifying circuit 11 through a normally-open switch 14.

When the switch 14 is open, the second amplifying circuit 12 is electrically isolated from the first amplifying circuit 11. In this situation, the gain of the preamplifier 1 is equal to the gain of the first amplifying circuit 11 alone, from which the voltage signal is output to the outside of the preamplifier 1.

When the switch 14 is closed, the output terminal of the second amplifying circuit 12 is connected to the input terminal of the first amplifying circuit 11. In this situation, both terminals of the capacitor 13 are connected through the second amplifying circuit 12 and the switch 14. The charge stored in the capacitor 13 is discharged through the second amplifying circuit 12 and the switch 14. In this way, the charge on the capacitor is reset. During the resetting, the signal output from the first amplifying circuit 11 is input to the first amplifying circuit 11 again through the second amplifying circuit 12 and the switch 14. Here, the gain of the entire circuit of the preamplifier 1 equals to a value obtained by multiplying the gain of the first amplifying circuit 11 and the gain of the second amplifying circuit 12 together. As the gain of the second amplifying circuit 12 is a positive gain of less than onefold, the loop gain of the entire circuit of the preamplifier 1 is less than the loop gain obtained when using the first amplifying circuit 11 alone.

Because the loop gain of the preamplifier 1 during the reset operation is less than a loop gain obtained when using the first amplifying circuit 11 alone, a phase margin will be greater and thus oscillation unlikely occurs during the reset operation. The preamplifier 1 may, therefore, prevent oscillation during the reset operation without increasing the compensation capacitance in the first amplifying circuit 11. In other words, the preamplifier 1 may reduce the compensation capacitance for the first amplifying circuit 11 while preventing oscillation during the reset operation. The smaller compensation capacitance of the first amplifying circuit 11 allows the processing speed of the first amplifying circuit 11 to be faster and can shorten the reset time and rise time for the voltage signal output from the preamplifier 1. As described above, the preamplifier 1 of the present invention can shorten the rise time for the voltage signal and the reset time while preventing oscillation. This shorter reset time and rise time for the voltage signal enables the radiation detector including the preamplifier 1 to have a shorter dead time in detecting radiation, achieving more effective radiation detection.

It is to be noted that an embodiment of a circuitry of the preamplifier 1 shown in FIG. 2 is a minimum configuration and the preamplifier 1 may include another circuit element. Furthermore, the preamplifier 1 may be composed of an integrated circuit. It is also to be noted that, in the radiation detector of the present invention, another radiation detecting element may be used as long as it outputs the charge signal in accordance with the energy of radiation detected, though an example in which the semiconductor detecting element is used as the radiation detecting element is provided in the present embodiment.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

What is claimed is:

1. An amplifier, comprising: a first amplifying circuit; a capacitor connected between an input terminal and an output terminal of the first amplifying circuit; a switch for discharging the capacitor; and a second amplifying circuit having a positive gain of less than onefold, and including an input terminal connected to the output terminal of the first amplifying circuit, wherein the switch is connected between the input terminal of the first amplifying circuit and an output terminal of the second amplifying circuit, and the first amplifying circuit receives a signal and outputs a signal to an area external to the amplifier.

2. A radiation detector, comprising: an amplifier according to claim 1; and a radiation detecting element generating a charge signal upon detection of radiation, wherein the amplifier receives a charge signal generated from the radiation detecting element and converts the input charge signal into a voltage signal.

3. An amplifier, comprising: a first amplifying circuit; a capacitor connected between an input terminal and an output terminal of the first amplifying circuit; a switch for discharging the capacitor; and a second amplifying circuit having a positive gain of less than onefold, and including an input terminal connected to the output terminal of the first amplifying circuit, wherein the switch is provided on a path between the input terminal of the first amplifying circuit and an output terminal of the second amplifying circuit, and the first amplifying circuit receives a signal and outputs a signal to an area external to the amplifier.

4. A radiation detector, comprising: an amplifier according to claim 3; and a radiation detecting element generating a charge signal upon detection of radiation, wherein the amplifier receives a charge signal generated from the radiation detecting element and converts the input charge signal into a voltage signal.

* * * * *